(12) United States Patent
Adusumilli et al.

(10) Patent No.: US 10,056,391 B2
(45) Date of Patent: *Aug. 21, 2018

(54) VERTICALLY STACKED FINFET FUSE

(71) Applicant: International Business Machines Corporation, Armonk, NY (US)

(72) Inventors: Praneet Adusumilli, Albany, NY (US); Alexander Reznicek, Troy, NY (US); Oscar van der Straten, Guilderland Center, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/661,820

(22) Filed: Jul. 27, 2017

(65) Prior Publication Data

US 2018/0026043 A1   Jan. 25, 2018

Related U.S. Application Data

(63) Continuation of application No. 15/216,335, filed on Jul. 21, 2016, now Pat. No. 9,735,165.

(51) Int. Cl.
  *H01L 27/112*  (2006.01)
  *H01L 29/78*   (2006.01)
  *H01L 23/525*  (2006.01)
  *H01L 29/08*   (2006.01)

(52) U.S. Cl.
  CPC .... *H01L 27/11206* (2013.01); *H01L 23/5256* (2013.01); *H01L 29/0847* (2013.01); *H01L 29/785* (2013.01)

(58) Field of Classification Search
  CPC ........... H01L 27/11206; H01L 23/5256; H01L 29/785; H01L 29/0847
  See application file for complete search history.

(56) References Cited

U.S. PATENT DOCUMENTS

| 3,849,755 | A | 11/1974 | Blewitt et al. |
| 6,033,939 | A | 3/2000 | Agarwala et al. |
| 8,848,423 | B2 | 9/2014 | Chung |
| 9,040,370 | B2 | 5/2015 | Yang |
| 9,240,375 | B2 | 1/2016 | Zhang et al. |
| 9,263,385 | B1 | 2/2016 | Singh et al. |
| 9,735,165 | B1 * | 8/2017 | Adusumilli ....... H01L 27/11206 |
| 2015/0123209 | A1 | 5/2015 | Choi et al. |
| 2015/0214369 | A1 | 7/2015 | Fronheiser |
| 2015/0318169 | A1 | 11/2015 | Qi |
| 2016/0268171 | A1 | 9/2016 | Wei |

OTHER PUBLICATIONS

List of IBM Patents or Patent Applications Treated as Related Dated Jul. 27, 2017, 2 Pages.

\* cited by examiner

*Primary Examiner* — Dung Le (74) *Attorney, Agent, or Firm* — Scully, Scott, Murphy & Presser, P.C.; Daniel P. Morris, Esq.

(57) ABSTRACT

A semiconductor structure including a stacked FinFET fuse is provided in which the stacked FinFET fuse includes a plurality of vertically stacked and spaced apart conductive semiconductor fin portions and a doped epitaxial semiconductor material structure located on exposed surfaces of each conductive semiconductor fin portion of the vertical stack. In the FinFET fuse, a topmost surface of a bottom doped epitaxial semiconductor material structure is merged to a bottommost surface of an overlying doped epitaxial semiconductor material structure.

18 Claims, 9 Drawing Sheets

FIG. 7B

VERTICALLY STACKED FINFET FUSE

BACKGROUND

The present application relates to a semiconductor structure and a method of forming the same. More particularly, the present application relates to a semiconductor structure including a stacked FinFET fuse and a method of forming such a semiconductor structure.

Monolithic three-dimensional (3D) integration is considered as an alternative approach to ultra-expensive extreme ultra-violet (EUV) techniques to continue density scaling. One scenario is to stack an n-type field effect transistor (i.e., nFET) and a p-type field effect transistor (i.e., pFET) on top of each other creating a stacked FinFET structure.

Stacked FinFET structures need fuses. Fuses are used in a variety of circuit applications. It is highly desired to fabricate on-chip fuses during stacked FinFET complementary metal oxide semiconductor (CMOS) fabrication to minimize cost and improve system integration. Using the same structure and source/drain regions as the high performance FinFET will simplify process complexity. Therefore, there is a need for providing stacked FinFET fuses for use in stacked FinFET structures.

SUMMARY

A semiconductor structure including a stacked FinFET fuse is provided in which the stacked FinFET fuse includes a plurality of vertically stacked and spaced apart conductive semiconductor fin portions and a doped epitaxial semiconductor material structure located on exposed surfaces of each conductive semiconductor fin portion of the vertical stack. In the FinFET fuse, a topmost surface of a bottom doped epitaxial semiconductor material structure is merged to a bottommost surface of an overlying doped epitaxial semiconductor material structure.

In one aspect of the present application, a semiconductor structure is provided. In one embodiment of the present application, the semiconductor structure includes a FinFET fuse located in a fuse area. The FinFET fuse includes a plurality of vertically stacked and spaced apart conductive semiconductor fin portions located one atop the other. The FinFET fuse further includes a doped epitaxial semiconductor material structure located on exposed surfaces of each conductive semiconductor fin portion of the plurality of vertically stacked and spaced apart conductive semiconductor fin portions, wherein a topmost surface of each doped epitaxial semiconductor material structure is merged with a bottommost surface of an overlying doped epitaxial semiconductor material structure.

In another aspect of the present application, a method of forming a semiconductor structure containing a FinFET fuse is provided. In one embodiment of the present application, the method may include providing a fin structure on a surface of an insulator layer, the fin structure comprising, from bottom to top, a first semiconductor fin portion, an insulator fin portion, and a second semiconductor fin portion. A gate structure is then formed straddling over a portion of the fin structure. Next, the fin structure is converted into a conductive fin structure by doping the first and second semiconductor fin portions, wherein the conductive fin structure comprises, from bottom to top, a first conductive semiconductor fin portion, the insulator fin portion and a second conductive semiconductor fin portion. Next the insulator fin portion is removed and, thereafter, a doped epitaxial semiconductor material structure is formed on exposed surfaces of each of the first and the second conductive semiconductor fin portions, wherein a topmost surface of the doped epitaxial semiconductor material structure formed on the first conductive semiconductor fin portion is merged with a bottommost surface of the doped epitaxial semiconductor material structure formed on the second conductive semiconductor fin portion.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1:
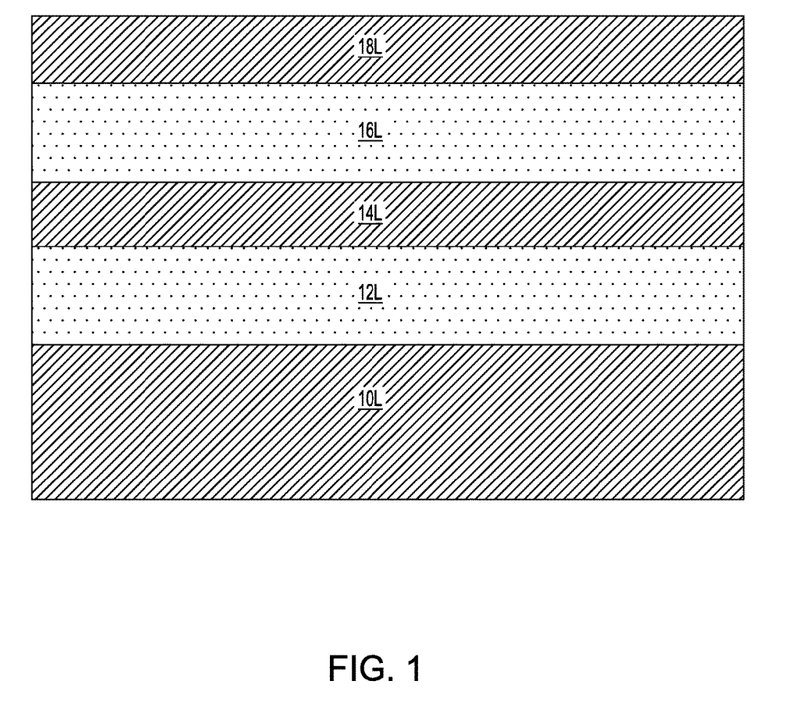
FIG. 1 is a cross sectional view of an exemplary semiconductor structure including a semiconductor substrate, a first insulator layer, a first semiconductor material layer, a second insulator layer and a second semiconductor material layer that can be employed in accordance with one embodiment of the present application.

Referring first to FIG. 1, there is illustrated an exemplary semiconductor structure that can be employed in accordance with an embodiment of the present application. As shown, the exemplary semiconductor structure of FIG. 1 includes a semiconductor substrate 10L, a first insulator layer 12L, a first semiconductor material layer 14L, a second insulator layer 16L and a second semiconductor material layer 18L. Although the present application describes and illustrates an exemplary semiconductor structure including two semiconductor material layers (i.e., the first and second semiconductor material layers (14L, 18L)) and two insulator layers (i.e., first and second insulator layers (12L, 16L)) present atop the semiconductor substrate 10L, the present application is not limited to that number. Instead, additional material stacks of, from bottom to top, of an insulator layer and a semiconductor material layer can be formed above the second semiconductor layer 18L; in the present application each semiconductor material layer is separated from another semiconductor material layer by an insulator layer. In one example, three additional materials stacks of insulator layers and semiconductor material layers can be formed on the second semiconductor material layer 18L shown in FIG. 1.

The semiconductor substrate 10L comprises any semiconductor material or multilayered stack of semiconductor materials having semiconducting properties; semiconductor substrate 10L is a bulk semiconductor substrate meaning that the substrate contains no insulator materials and/or conductive materials. Illustrative examples of semiconductor materials that can be employed as the semiconductor substrate 10L include, but are not limited to, silicon (Si), germanium (Ge), silicon germanium alloys (SiGe), III-V compound semiconductors and/or II-VI compound semiconductors. III-V compound semiconductors include at least one element from Group III (i.e., Group 13) of the Periodic Table of Elements and at least one element from Group V (i.e., Group 15) of the Periodic Table of Elements, while II-VI compound semiconductors include at least one element from Group II (i.e., Group 2) of the Periodic Table of Elements and at least one element from Group VI (i.e., Group 16) of the Periodic Table of Elements). In one example, the semiconductor substrate 10L may be entirely composed of single crystal silicon.

The first and second semiconductor material layers (14L, 18L) and any other semiconductor material layer that are employed may include one of the semiconductor materials mentioned above for semiconductor substrate 10L. In one embodiment of the present application, the first and second semiconductor material layers (14L, 18L) and any other semiconductor material layer that are employed may include a same semiconductor material as the semiconductor substrate 10L. In another embodiment of the present application, the first and second semiconductor material layers (14L, 18L) and any other semiconductor material layer that are employed may include a semiconductor material that differs from the semiconductor material of the semiconductor substrate 10L.

In one embodiment of the present application, the first and second semiconductor material layers (14L, 18L) and any other semiconductor material layer that are employed may each include a same semiconductor material. In another embodiment of the present application, at least one of the semiconductor material layers includes a semiconductor material that differs from a semiconductor material of another semiconductor material layer. For example, the first semiconductor material layer 14L may be composed of silicon, while the second semiconductor material layer 18L may be composed of a silicon germanium alloy or a III-V compound semiconductor.

In the present application, the first and second semiconductor material layers (14L, 18L) and any other semiconductor material layer that are employed are single crystalline semiconductor materials that are non-doped. In the present application, the first and second semiconductor material layers (14L, 18L) and any other semiconductor material layer that are employed may have a thickness from 10 nm to 200 nm; other thicknesses are possible and are thus not excluded from being used in the present application.

The first and second insulator layers (12L, 16L) and any other insulator layer that are employed to separate a bottom semiconductor material layer from a top semiconductor material layer may include a crystalline or non-crystalline dielectric oxide or dielectric nitride. In one example, the first and second insulator layers (12L, 16L) and any other insulator layer that are employed to separate a bottom semiconductor material layer from a top semiconductor material layer may be composed of silicon dioxide.

In one embodiment of the present application, the first and second insulator layers (12L, 16L) and any other insulator layer that are employed to separate a bottom semiconductor material layer from a top semiconductor material layer may comprise a same dielectric material. In another embodiment of the present application, at least one of the insulator layers used to separate a bottom semiconductor material layer from a top semiconductor material layer is composed of a dielectric material that differs from another insulator layer that performs the same function. For example, first insulator layer 12L may be composed of silicon dioxide, while second insulator layer 16L may be composed of boron nitride.

In the present application, the first and second insulator layers (12L, 16L) and any other insulator layer that are employed to separate a bottom semiconductor material layer from a top semiconductor material layer may have a thickness from 10 nm to 100 nm; other thicknesses are possible and are thus not excluded from being used in the present application.

The exemplary semiconductor structure of FIG. 1 can be formed utilizing any well known wafer bonding process. For example, a first wafer of the semiconductor substrate 10L, the first insulator layer 12L and the first semiconductor material layer 14L, collectively referred to as a semiconductor-on-insulator (SOI) substrate, and a second wafer containing the second insulator layer 16L and the second semiconductor material layer 18L are provided, and thereafter the second insulator layer 16L of the second wafer is bonded to the first semiconductor material layer 14L of the SOI substrate. In some embodiments of the present application, the SOI wafer may be provided by wafer bonding or by an oxygen ion implantation process referred to as SIMOX (separation by ion implantation of oxygen). The second wafer can, in some embodiments, be formed by depositing or thermally growing a dielectric material on a surface of a semiconductor material layer.

Additional wafers like the second wafer including an insulator layer and a semiconductor material layer can be provided and bonded to the second semiconductor material layer 18L in a stacked manner one atop the other and with the insulator layer of the additional wafer(s) being bonded to an exposed surface of a semiconductor material layer.

Figure 2A:
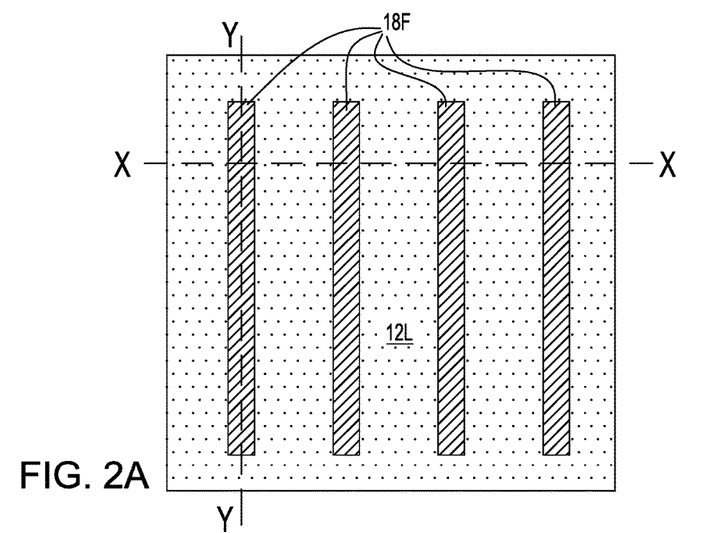
FIG. 2A is a top down view of the exemplary semiconductor structure of FIG. 1 after patterning the second semiconductor material layer, the second insulator layer and the first semiconductor material layer to provide a plurality of fin structures located on a surface of the first insulator layer.
Figure 2B:
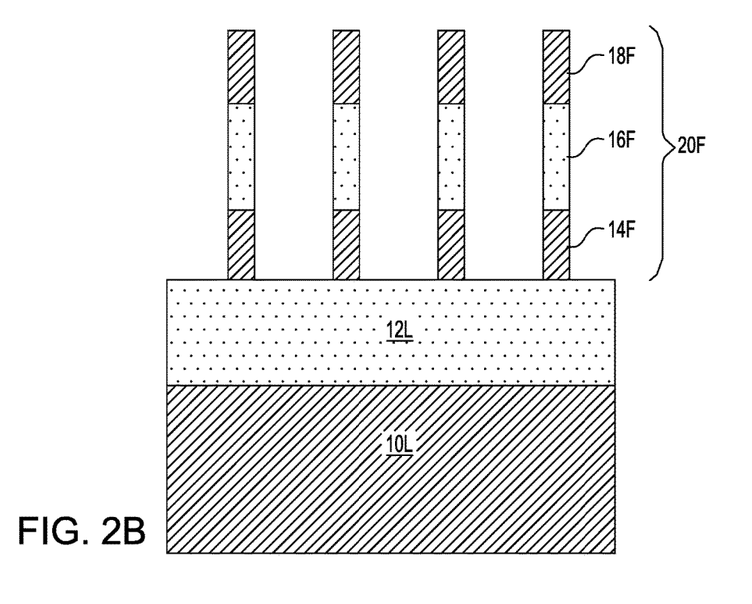
FIG. 2B is a cross sectional view of the exemplary semiconductor structure of FIG. 2A along the vertical plane X-X.
Figure 2C:
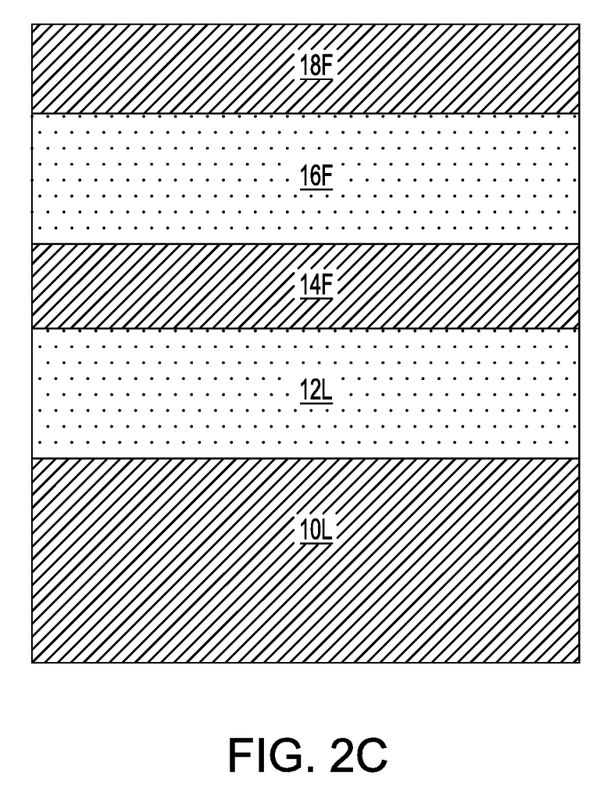
FIG. 2C is a cross sectional view of the exemplary semiconductor structure of FIG. 2A along the vertical plane Y-Y.

Referring now to FIGS. 2A, 2B and 2C, there are illustrated varies views of the exemplary semiconductor structure of FIG. 1 after patterning the second semiconductor material layer 18L, the second insulator layer 16L and the first semiconductor material layer 14L to provide a plurality of fin structures 20F located on a surface of the first insulator layer 12L. In the illustrated embodiment of the present application, each fin structure 20F includes a remaining portion of the first semiconductor material layer 14L (hereinafter referred to as a first semiconductor fin portion 14F), a remaining portion of the second insulator layer 16L (hereinafter referred to as an insulator fin portion 16F) and a remaining portion of the second semiconductor material layer 18L (hereinafter referred to as a second semiconductor fin portion 18F). The number of fin structures 20F may vary and can be as small as one fin structure, two fin structures, three fin structures, etc. In the drawings and by way of one example, four fin structures 20F are shown.

As used herein, a "fin structure" refers to a contiguous material stack of semiconductor materials and dielectric materials, and including a pair of vertical sidewalls that are parallel to each other. As used herein, a surface is "vertical" if there exists a vertical plane from which the surface does not deviate by more than three times the root mean square roughness of the surface. In one embodiment of the present application, each fin structure 20F may have a width from 4 nm to 30 nm; the height of each fin structure 20F may be from 10 nm to 150 nm. Other widths and heights that are lesser than, or greater than the ranges mentioned herein can also be used in the present application. Each fin structure 20F can be separated by a gap that has a width, w1, from 20 nm to 50 nm. As is shown in FIG. 2B, the sidewall surfaces of each of the first semiconductor fin portion 14F, the insulator fin portion 16F and the second semiconductor fin portion 18F are vertically aligned with each other.

Each fin structure 20F can be formed utilizing a patterning process. In one embodiment of the present application, the patterning process used to define each fin structure 20F may include lithography and etching. Lithography includes forming a photoresist material (not shown) atop a material or material stack to be patterned. The photoresist material may include a positive-tone photoresist composition, a negative-tone photoresist composition or a hybrid-tone photoresist composition. The photoresist material may be formed by a deposition process such as, for example, spin-on coating. After forming the photoresist material, the deposited photoresist material is subjected to a pattern of irradiation. Next, the exposed photoresist material is developed utilizing a conventional resist developer. This provides a patterned photoresist atop a portion of the material or material stack to be patterned. The pattern provided by the patterned photoresist material is thereafter transferred into the underlying material layer or material layers utilizing at least one pattern transfer etching process. Typically, the at least one pattern transfer etching process is an anisotropic etch. In one embodiment, a dry etching process such as, for example, reactive ion etching can be used. In another embodiment, a chemical etchant can be used. In still a further embodiment, a combination of dry etching and wet etching can be used. In the present application, the etch stops on a surface of the first insulator layer 12L.

In another embodiment, the patterning process may include a sidewall image transfer (SIT) process. The SIT process includes forming a mandrel material layer (not shown) atop the material or material layers that are to be patterned. The mandrel material layer (not shown) can include any material (semiconductor, dielectric or conductive) that can be selectively removed from the structure during a subsequently performed etching process. In one embodiment, the mandrel material layer (not shown) may be composed of amorphous silicon or polysilicon. In another embodiment, the mandrel material layer (not shown) may be composed of a metal such as, for example, Al, W, or Cu. The mandrel material layer (not shown) can be formed, for example, by chemical vapor deposition or plasma enhanced chemical vapor deposition. Following deposition of the mandrel material layer (not shown), the mandrel material layer (not shown) can be patterned by lithography and etching to form a plurality of mandrel structures (also not shown) on the topmost surface of the structure.

The SIT process continues by forming a spacer on each sidewall of each mandrel structure. The spacer which can be composed of any material that has a different etch selectivity than the mandrel material can be formed by deposition of a spacer material and then etching the deposited spacer material. In one example, the spacer material may be composed of any dielectric spacer material such as, for example, silicon dioxide, silicon nitride or a dielectric metal oxide. Examples of deposition processes that can be used in providing the spacer material include, for example, chemical vapor deposition (CVD), plasma enhanced chemical vapor deposition (PECVD), or atomic layer deposition (ALD). Examples of etching that be used in providing the spacers include any etching process such as, for example, reactive ion etching. After formation of the spacers, the SIT process continues by removing each mandrel structure. Each mandrel structure can be removed by an etching process that is selective for removing the mandrel material. Following the mandrel structure removal, the SIT process continues by transferring the pattern provided by the spacers into the underlying material or material layers. The pattern transfer may be achieved by utilizing at least one etching process. Examples of etching processes that can used to transfer the pattern may include dry etching (i.e., reactive ion etching, plasma etching, and ion beam etching or laser ablation) and/or a chemical wet etch process. In one example, the etch process used to transfer the pattern may include one or more reactive ion etching steps. Upon completion of the pattern transfer, the SIT process concludes by removing the spacers from the structure. Each spacer may be removed by etching or a planarization process.

In yet another embodiment, the patterning process may include a direct self-assembly (DSA) patterning process.

Figure 3A:
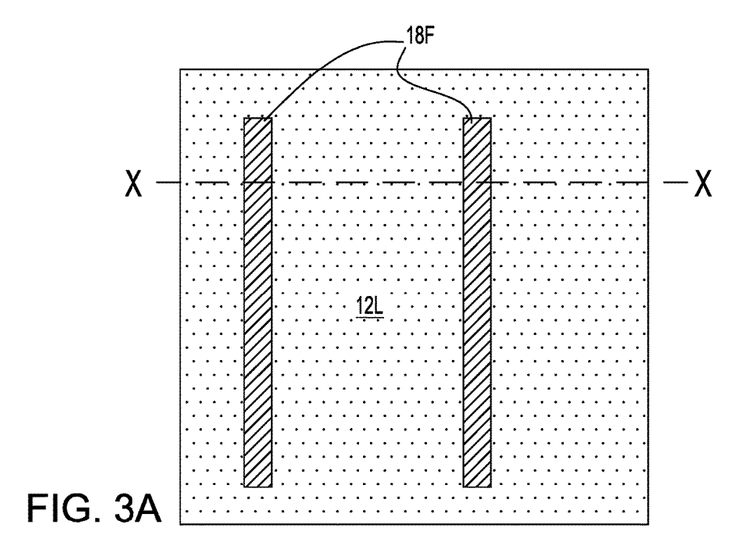
FIG. 3A is a top down view of the exemplary semiconductor structure of FIGS. 2A, 2B and 2C after removing some of the fin structures of the plurality of fin structures.
Figure 3B:
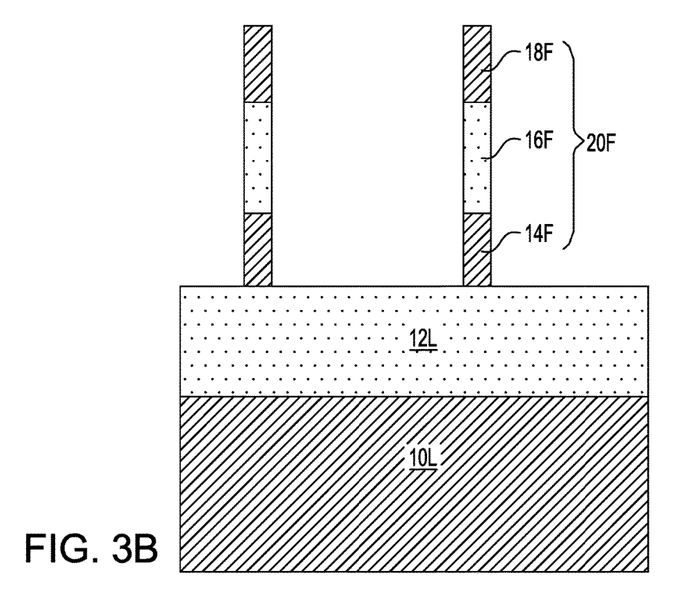
FIG. 3B is a cross sectional view of the exemplary semiconductor structure of FIG. 3A along the vertical plane X-X.

Referring now to FIGS. 3A-3B, there are illustrated various views of the exemplary semiconductor structure of FIGS. 2A, 2B and 2C after removing some of the fin structures 20F of the plurality of fin structures 20F. In some embodiments and when the pitch (i.e., gap) between each fin structure 20F is 60 nm or greater, this step of the present application may be omitted. The removal of some of the fin structures 20F may be performed utilizing lithography and etching or any other fin cutting process well known to those skilled in the art.

Figure 4A:
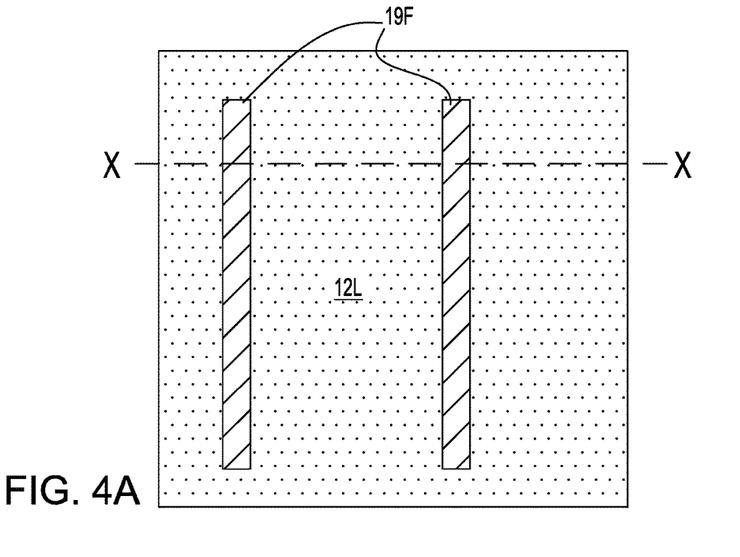
FIG. 4A is a top down view of the exemplary semiconductor structure of FIGS. 3A-3B after converting exposed portions of each semiconductor fin portion of the remaining fin structures into a conductive fin containing conductive semiconductor fin portions.
Figure 4B:
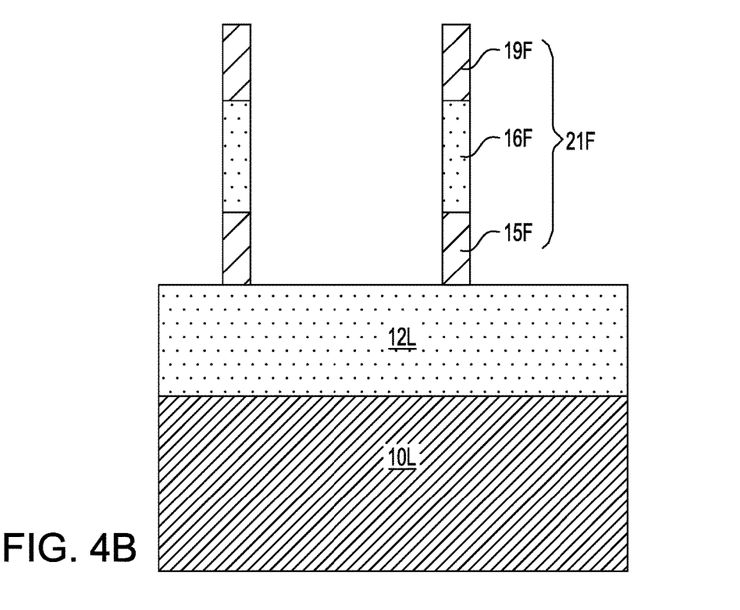
FIG. 4B is a cross sectional view of the exemplary semiconductor structure of FIG. 4A along the vertical plane X-X.

Referring now to FIGS. 4A-4B, there are illustrated various views of the exemplary semiconductor structure of FIGS. 3A-3B after converting exposed portions of each semiconductor fin portion (i.e., first semiconductor fin portion 14F and second semiconductor fin portion 18F) of the remaining fin structures 20F into a conductive semiconductor fin portion. In the drawings of the present application, element 15F denotes a first conductive semiconductor fin portion derived from first semiconductor fin portion 14F, while element 19F denotes a second conductive semiconductor fin portion derived from second semiconductor fin portion 18F; no change is made to the insulator fin portion 16F. In the illustrated embodiment, the conversion provides a conductive fin structure 21F that includes the first conductive semiconductor fin portion 15F, the insulator fin portion 16F and the second conductive semiconductor fin portion 19F. Like fin structure 20F, the first conductive semiconductor fin portion 15F, the insulator fin portion 16F and the second conductive semiconductor fin portion 19F of each conductive fin structure 21F have sidewall surfaces that are vertically aligned to each other.

The conversion occurs in an area of the structure in which FinFET fuses are to be formed. In other areas of the structure (not shown and to the periphery of the area illustrated in the drawings), no conversion occurs. In those areas in which non conversion occurs, FinFET devices can be subsequently formed. In the present application, the conversion may include forming a block mask over some areas of the structure, while leaving other areas of the structure exposed for further processing. The exposed areas are then subjected to a gas phase doping process in which an n-type or p-type dopant is introduced into each of the semiconductor fin portions so to provide conductive semiconductor fin portions. Each conductive semiconductor fin portion that is obtained thus contains the semiconductor material of the semiconductor fin portion and added dopant.

The term "p-type" refers to the addition of impurities to an intrinsic semiconductor that creates deficiencies of valence electrons. Examples of p-type dopants, i.e., impurities, include, but are not limited to, boron, aluminum, gallium and indium. "N-type" refers to the addition of impurities that contributes free electrons to an intrinsic semiconductor. Examples of n-type dopants, i.e., impurities, include, but are not limited to, antimony, arsenic and phosphorous. Each semiconductor fin portion (i.e., the first and second semiconductor fin portions (15F, 19F)) may have a dopant concentration the can range from 5e18 atoms/cm$^3$ to 1.5e21 atoms/cm$^3$.

In some embodiments of the present application, each conductive semiconductor fin portion (i.e., the first and second semiconductor fin portions (15F, 19F)) has a uniform dopant distribution throughout the entirety of the conductive semiconductor fin portion. In other embodiments, each conductive semiconductor fin portion (i.e., the first and second semiconductor fin portions (15F, 19F)) has a gradient dopant distribution in which the dopant concentration is greatest at the sidewall surfaces and increases inward to a central portion of each conductive semiconductor fin portion.

Figure 5A:
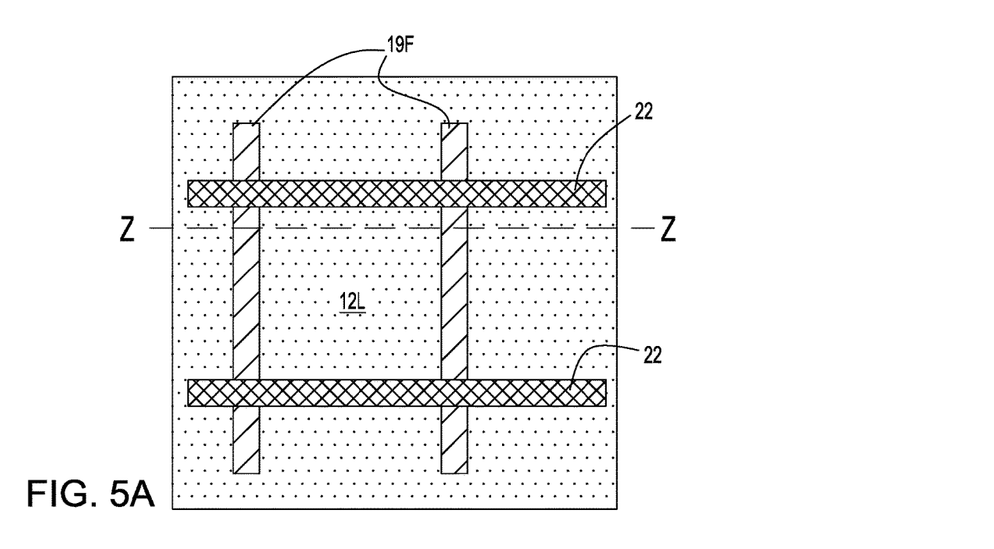
FIG. 5A is a top down view of the exemplary semiconductor structure of FIGS. 4A-4B after forming a gate structure straddling over a portion of each conductive fin structure.
Figure 5B:
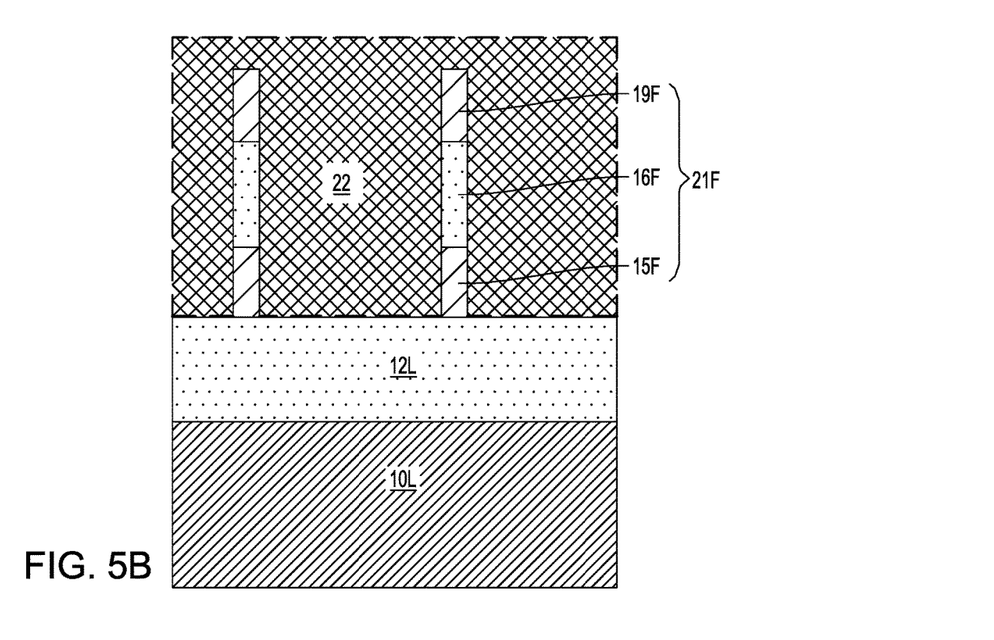
FIG. 5B is a cross sectional view of the exemplary semiconductor structure of FIG. 5A along the vertical plane Z-Z.

Referring now to FIGS. 5A-5B, there are illustrated the exemplary semiconductor structure of FIGS. 4A-4B after forming a gate structure 22 straddling over a portion of each conductive fin structure 21F; in FIG. 5B which is a cross sectional view between the conductive semiconductor fins 21F, the gate structure 22 is shown with dotted lines to denote that it is located behind the cross sectional view illustrated.

The number of gate structures can vary so long as at least one gate structure 22 is formed. Each gate structure 22 is orientated perpendicular to a given conductive fin structure 21F. Each gate structure 22 that is formed is a dummy or non-functional gate structure which is employed in the present application as an anchoring element. Each gate structure 22 may include a single material or a material stack of different materials. In one example, the gate structure 22 may include a sacrificial gate material such as, for example, polysilicon. In another example, the gate structure 22 may include a sacrificial gate dielectric material (i.e., silicon dioxide) and a sacrificial gate material. Each gate structure 22 can be formed by deposition, followed by lithography and etching to define the gate structure 22. In some embodiments (not shown), a dielectric spacer including a dielectric spacer material such as, for example, silicon nitride or silicon dioxide, may be formed on exposed sidewall surfaces of each gate structure 22. The dielectric spacer can be formed by deposition of the dielectric spacer material, followed by a spacer etch such as, reactive ion etching.

Figure 6:
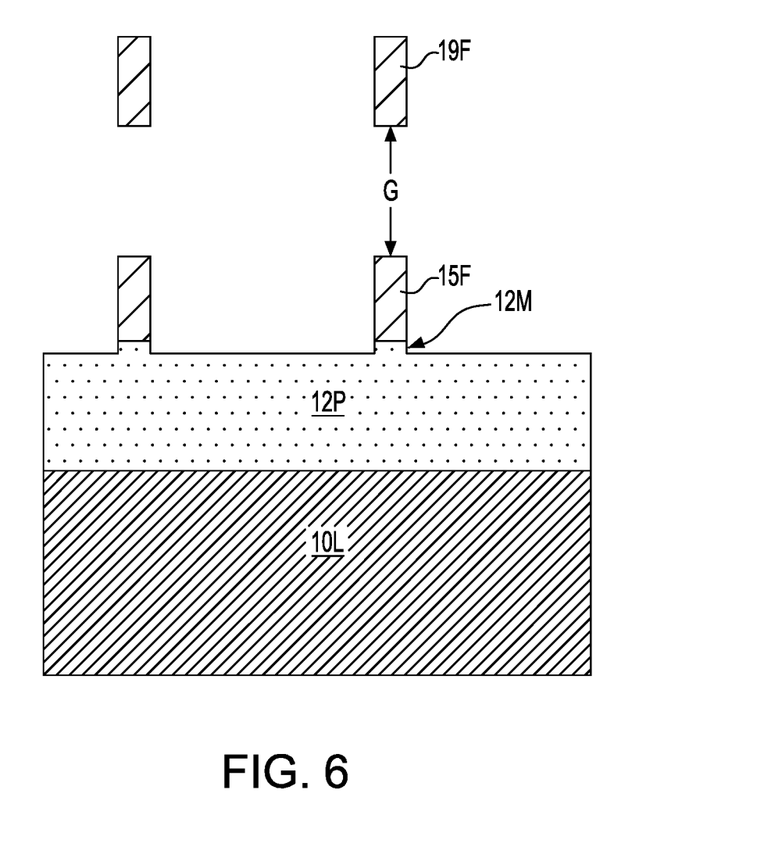
FIG. 6 is a cross sectional view of the exemplary semiconductor structure of FIGS. 5A-5B and along the vertical plane Z-Z after removing an insulator fin portion of each conductive fin structure.

Referring now to FIG. 6, there is illustrated the exemplary semiconductor structure of FIGS. 5A-5B and along the vertical plane Z-Z after removing each insulator fin portion (i.e., insulator fin portion 14F) of each conductive fin structure 21F. Each insulator fin portion (i.e., insulator fin portion 14F) of each conductive fin structure 21F can be removed utilizing an etching process that is selective in removing the dielectric material that provides each insulator fin portion (i.e., insulator fin portion 14F). In one example, each insulator fin portion (i.e., insulator fin portion 14F) can be removed utilizing hydrofluoric acid or a buffered oxide etch (a solution containing a mixture of ammonium fluoride and hydrofluoric acid). In embodiments in which each insulator fin portion (i.e., insulator fin portion 14F) and the first insulator layer 12L are composed of a same dielectric material, an upper portion of the first insulator layer 12L not protected by a conductive fin structure 21F can be removed.

As is shown, a plurality of vertically stacked conductive semiconductor fin portions (i.e., 15F, 19F, etc) located one atop the other is provided. Each conductive semiconductor fin portion (i.e., 15F, 17F, etc.) is spaced apart from each other by gap, G. As is further shown in the illustrated embodiment of FIG. 6, a bottommost conductive semiconductor fin portion (i.e., first conductive semiconductor fin portion 15F) of each vertically stacked conductive semiconductor fin portion has a bottommost surface that is in direct physical contact with a mesa surface 12M of a remaining portion of the insulator layer 12L. The remaining portion of the insulator layer 12L is labeled as 12P in FIG. 6. The bottommost conductive semiconductor fin portion (i.e., the first conductive fin portion 15F) has sidewall surfaces that are vertically aligned to sidewall surfaces of the mesa surface 12M. Moreover, each overlying conductive semiconductor fin portion present above the bottommost conductive semiconductor fin portion has sidewall surfaces that are vertically aligned to the sidewall surfaces of the bottommost conductive semiconductor fin portion, i.e., the sidewall surfaces of second conductive semiconductor fin portion 19F are vertically aligned to the sidewall surfaces of the first conductive semiconductor fin portion 15F, which in turn is vertically aligned to the sidewall surfaces of the mesa surface 12M.

Figure 7A:
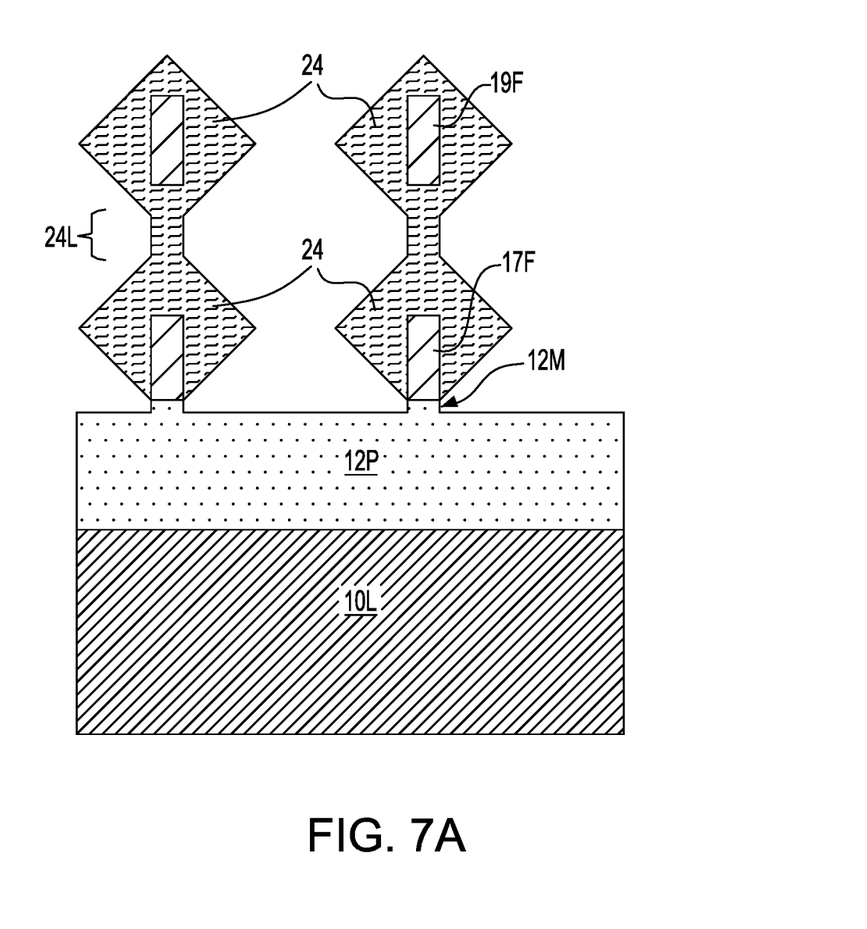
FIG. 7A is a cross sectional view of the exemplary semiconductor structure of FIG. 6 after epitaxial growth of a doped semiconductor material structure in accordance with one embodiment of the present application.
Figure 7B:
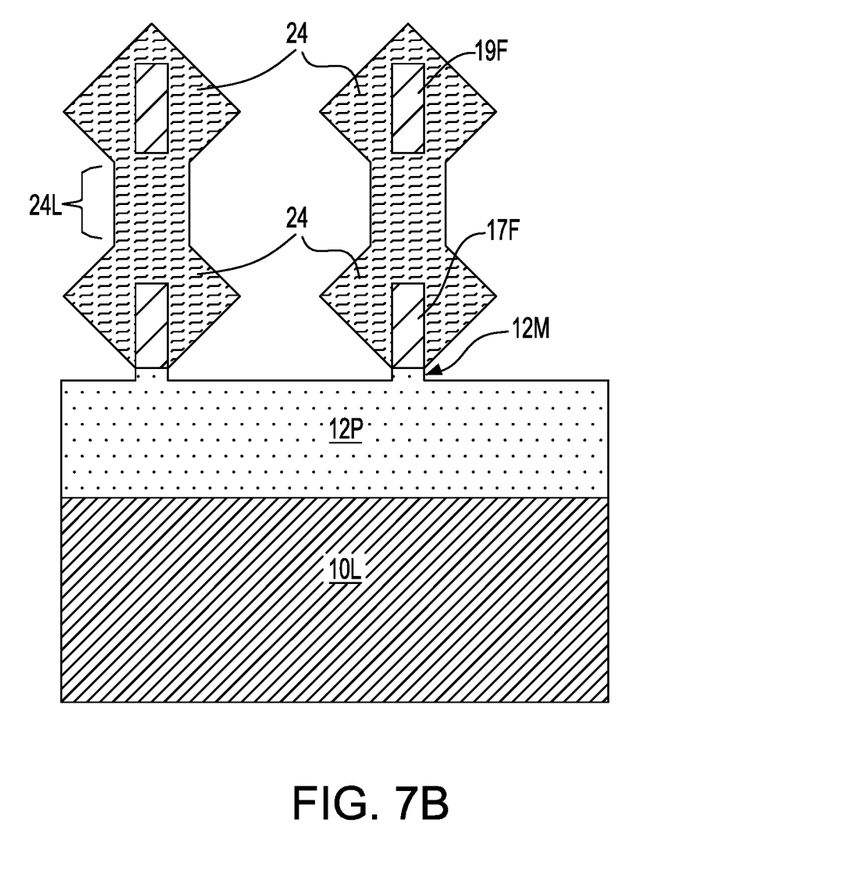
FIG. 7B is a cross sectional view of the exemplary semiconductor structure of FIG. 6 after epitaxial growth of a doped semiconductor material structure in accordance with one embodiment of the present application.

Referring now to FIGS. 7A-7B, there are shown the exemplary semiconductor structure of FIG. 6 after epitaxial growth of a doped semiconductor material structure 24. FIG. 7A and FIG. 7B are identical except for the thickness of region 24L which defines a fuse region of a FinFET fuse structure illustrated in FIGS. 7A-7B.

Notably, FIGS. 7A-7B exemplify semiconductor structures of the present application which include a FinFET fuse located in a fuse area. The FinFET fuse includes a plurality of vertically stacked and spaced apart conductive semiconductor fin portions (i.e., 17F, 19F) located one atop the other. The FinFET fuse further includes a doped epitaxial semiconductor material structure 24 located on exposed surfaces of each conductive semiconductor fin portion (i.e., 15F, 19F) of the plurality of vertically stacked and spaced apart conductive semiconductor fin portions. As is shown, a topmost surface (i.e., tip in the illustrated embodiment) of each doped epitaxial semiconductor material structure 24 is merged with a bottommost surface (i.e., tip in the illustrated embodiment) of an overlying doped epitaxial semiconductor material structure 24. The merging occurs at fuse region 24L. In the illustrated above, a topmost tip of the doped epitaxial semiconductor material structure 24 present on the surface of the first conductive fin portion 15F is merged with a bottommost tip of an overlying doped epitaxial semiconductor material structure 24 that is present on the surface of the second conductive fin portion 19F. The merging and formation of fuse region 24L occurs in gap, G, mentioned above.

In one embodiment of the present application, each doped epitaxial semiconductor material structure 24 is diamond shaped. In one example, each doped epitaxial semiconductor material structure 24 is diamond shaped and bound by (111) planes.

In the present application, each doped epitaxial semiconductor material structure 24 comprises a same semiconductor material and contains either a p-type dopant or n-type dopant as defined above. The semiconductor material used to provide each doped epitaxial semiconductor material structure 24 includes one of the semiconductor mentioned above for the semiconductor substrate 10L. The semiconductor material used to provide the doped epitaxial semiconductor material structures 24 may be the same as, or different from, the semiconductor material of a particular conductive semiconductor fin portion (i.e., 15F, 19F).

In the present application, each doped epitaxial semiconductor material structure 24 comprises a same dopant type (i.e., n-type or p-type) and a same dopant concentration. In the present application, each doped epitaxial semiconductor material structure 24 may have a dopant concentration that is the same as, or different from, the dopant concentration of the conductive semiconductor fin portions (15F, 19F).

Each doped epitaxial semiconductor material structure 24 is formed by epitaxial growth or deposition. The terms "epitaxial growth and/or deposition" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of a semiconductor material with sufficient energy to move around on the surface and orient themselves to the crystal arrangement of the atoms of the deposition surface. Therefore, an epitaxial semiconductor material that is formed by an epitaxial deposition process has the same crystalline characteristics as the deposition surface on which it is formed. For example, an epitaxial semiconductor material deposited on a {100} crystal surface will take on a {100} orientation. In the present application, each doped epitaxial semiconductor material structure 24 has a same crystalline characteristic as the surface of the conductive semiconductor fin portion that is it grown from.

Examples of various epitaxial growth process apparatuses that are suitable for use in the present application may include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE) or metal-organic CVD (MOCVD). The temperature for epitaxial deposition process typically ranges from 250° C. to 900° C. Although higher temperature typically results in faster deposition, the faster deposition may result in crystal defects and film cracking. A number of different source gases may be used for the deposition of the doped epitaxial semiconductor structure. In some embodiments, the source gas for the deposition may include a silicon containing gas source or a mixture of a silicon containing gas source and a germanium containing gas source. Carrier gases like hydrogen, nitrogen, helium and argon can be used. The dopant is typically added during the epitaxial growth process itself.

At this point of the present application, the FinFET devices can be formed utilizing methods well known in the art in the other areas of the structure. Also, contact structures including a contact metal or metal alloy formed into an interlevel dielectric material can be formed utilizing conventional techniques and materials well known to those skilled in the art. The contact structure can be designed to contact surfaces of each doped epitaxial semiconductor material structure 24 mentioned above in the fuse area of the structure.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
a FinFET fuse present in a fuse area and comprising a plurality of vertically stacked and spaced apart conductive semiconductor fin portions located one atop the other, and a doped epitaxial semiconductor material structure located on exposed surfaces of each conductive semiconductor fin portion of said plurality of vertically stacked and spaced apart conductive semiconductor fin portions, wherein a topmost surface of each doped epitaxial semiconductor material structure is merged with a bottommost surface of an overlying doped epitaxial semiconductor material structure.

2. The semiconductor structure of claim 1, wherein each doped epitaxial semiconductor material structure comprises a same semiconductor material.

3. The semiconductor structure of claim 2, wherein each doped epitaxial semiconductor material structure comprises a same dopant type and a same dopant concentration.

4. The semiconductor structure of claim 1, wherein a bottommost conductive semiconductor fin portion of said plurality of vertically stacked and spaced apart conductive semiconductor fin portions has a bottommost surface in direct physical contact with a mesa surface of insulator layer.

5. The semiconductor structure of claim 4, wherein said bottommost conductive semiconductor fin portion has sidewall surfaces that are vertically aligned to sidewall surfaces of said mesa surface of said insulator layer.

6. The semiconductor structure of claim 5, wherein each overlying conductive semiconductor fin portion present above the bottommost conductive semiconductor fin portion has sidewall surfaces that are vertically aligned to said sidewall surfaces of said bottommost conductive semiconductor fin portion.

7. The semiconductor structure of claim 1, wherein each conductive semiconductor fin portion comprises a same semiconductor material.

8. The semiconductor structure of claim 1, wherein at least one of said conductive semiconductor fin portions comprises a semiconductor material that differs from a semiconductor material of at least one other conductive semiconductor fin portion.

9. The semiconductor structure of claim 1, wherein each conductive semiconductor fin portion comprises a same dopant type and a same dopant concentration.

10. A method of forming a semiconductor structure, said method comprising:
providing a fin structure on a surface of an insulator layer, said fin structure comprising, from bottom to top, a first semiconductor fin portion, an insulator fin portion, and a second semiconductor fin portion;
forming a gate structure straddling over a portion of said fin structure;
converting said fin structure into a conductive fin structure by doping said first and second semiconductor fin portions, wherein said conductive fin structure comprises, from bottom to top, a first conductive semiconductor fin portion, said insulator fin portion and a second conductive semiconductor fin portion;
removing said insulator fin portion; and
forming a doped epitaxial semiconductor material structure on exposed surfaces of said first and said second conductive semiconductor fin portions, wherein a topmost surface of said doped epitaxial semiconductor material structure formed on said first conductive semiconductor fin portion is merged with a bottommost surface of said doped epitaxial semiconductor material structure formed on said second conductive semiconductor fin portion.

11. The method of claim 10, wherein each doped epitaxial semiconductor material structure comprises a same semiconductor material.

12. The method of claim 11, wherein each doped epitaxial semiconductor material structure comprises a same dopant type and a same dopant concentration.

13. The method of claim 10, wherein said removing said insulator fin portion also removes exposed portions of said insulator layer, and said conductive fin structure is present on a mesa surface of a remaining portion of said insulator layer.

14. The method of claim 13, wherein said first conductive semiconductor fin portion has a bottommost surface in direct physical contact with a mesa surface of said remaining portion of said insulator layer.

15. The method of claim 13, wherein said first conductive semiconductor fin portion has sidewall surfaces that are vertically aligned to sidewall surfaces of said mesa surface of said remaining portion of said insulator layer.

16. The method of claim 15, wherein said second conductive semiconductor fin portion has sidewall surfaces that are vertically aligned to said sidewall surfaces of said first conductive semiconductor fin portion.

17. The method of claim 10, wherein said doping comprises gas phase doping.

18. The method of claim 10, wherein each conductive semiconductor fin portion comprises a same dopant type, a same dopant concentration and a same semiconductor material.

* * * * *